(12) United States Patent
Furukawa et al.

(10) Patent No.: US 8,039,334 B2
(45) Date of Patent: Oct. 18, 2011

(54) SHARED GATE FOR CONVENTIONAL PLANAR DEVICE AND HORIZONTAL CNT

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Mark E. Masters, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/902,944

(22) Filed: Oct. 12, 2010

(65) Prior Publication Data

US 2011/0027951 A1 Feb. 3, 2011

Related U.S. Application Data

(62) Division of application No. 11/161,146, filed on Jul. 25, 2005, now Pat. No. 7,838,943.

(51) Int. Cl.
*H01L 21/8234* (2006.01)

(52) U.S. Cl. ........ 438/198; 438/195; 438/199; 438/200; 257/24; 257/E21.621; 977/742

(58) Field of Classification Search .......... 438/195–200; 257/24, E21.621; 977/742
See application file for complete search history.

(56) References Cited

U.S. PATENT DOCUMENTS

| | | | |
|---|---|---|---|
| 6,750,471 B2 * | 6/2004 | Bethune et al. | 257/40 |
| 6,821,911 B1 | 11/2004 | Lo et al. | |
| 7,247,877 B2 | 7/2007 | Hakey et al. | |
| 7,288,970 B2 * | 10/2007 | Bertin | 326/120 |
| 7,484,423 B2 * | 2/2009 | Hakey et al. | 73/779 |
| 7,535,016 B2 | 5/2009 | Furukawa et al. | |
| 2001/0023986 A1 | 9/2001 | Mancevski | |
| 2002/0175390 A1 | 11/2002 | Goldstein et al. | |
| 2003/0098640 A1 | 5/2003 | Kishi et al. | |
| 2003/0134267 A1 | 7/2003 | Kang et al. | |
| 2003/0165418 A1 | 9/2003 | Ajayan et al. | |
| 2003/0168683 A1 | 9/2003 | Farnsworth et al. | |
| 2003/0178617 A1 * | 9/2003 | Appenzeller et al. | 257/20 |
| 2003/0230782 A1 | 12/2003 | Choi et al. | |
| 2004/0004235 A1 | 1/2004 | Lee et al. | |

(Continued)

OTHER PUBLICATIONS

S. Iijima, et al. "Helical Microtubes of Graphite Carbon", Nature 354, 56 (1991); D.S. Bethune, et al. "Cobalt Catalyzed Growth of Carbon Nanotubes with Single-Atomic-Layer Walls" Nature 363, 605 (1993).

(Continued)

*Primary Examiner* — Thinh Nguyen
(74) *Attorney, Agent, or Firm* — Scully, Scott, Murphy & Presser, P.C.; Richard A. Kotulak, Esq.

(57) ABSTRACT

A semiconductor structure in which a planar semiconductor device and a horizontal carbon nanotube transistor have a shared gate and a method of fabricating the same are provided in the present application. The hybrid semiconductor structure includes at least one horizontal carbon nanotube transistor and at least one planar semiconductor device, in which the at least one horizontal carbon nanotube transistor and the at least one planar semiconductor device have a shared gate and the at least one horizontal carbon nanotube transistor is located above a gate of the at least one planar semiconductor device.

15 Claims, 18 Drawing Sheets

U.S. PATENT DOCUMENTS

2004/0095837 A1    5/2004  Choi et al.
2004/0120183 A1    6/2004  Appenzeller et al.
2006/0038179 A1*   2/2006  Afzali-Ardakani et al. .... 257/67
2006/0060839 A1*   3/2006  Chandross et al. ............. 257/40

OTHER PUBLICATIONS

R. Saito, et al. "Physical Properties of Carbon Nanotubes", Imperial College Press (1998) Chapter 5.

Bethune, et al., "Cobalt Catalyzed Growth of Carbon Nanotubes with Single-Atomic-Layer Walls" Nature 363, 605 (1993).

Martel, et al., "Carbon nanotube field effect transistors for logic applications", *Electron Devices Meeting, 2001. IEDM Technical Digest International*, Dec. 2, 2001-Dec. 5, 2001, pp. 7.5.1-7.5.4.

* cited by examiner

SHARED GATE FOR CONVENTIONAL PLANAR DEVICE AND HORIZONTAL CNT

CROSS REFERENCE TO RELATED APPLICATION

This application is a divisional of U.S. patent application Ser. No. 11/161,146, filed Jul. 25, 2005 the entire content and disclosure of which is incorporated herein by reference.

DESCRIPTION

1. Field of the Invention

The present invention relates to a semiconductor structure and to a method of fabricating the same. More particularly, the present invention relates to a hybrid semiconductor structure that includes a horizontal carbon nanotube transistor (CNT) and a planar semiconductor device in which the horizontal carbon nanotube transistor and the planar semiconductor device have a shared gate, and a method of forming the hybrid semiconductor structure.

2. Background

In the field of molecular electronics, few materials show as much promise as carbon nanotubes that comprise hollow cylinders of graphite that have a diameter of a few nanometers. Nanotubes can be implemented in electronic devices, such as, for example, diodes, field effect transistors (FETs), and conductive wiring depending on the nanotube characteristics. Nanotubes are unique for their size, shape and physical properties. For example, carbon based nanotubes resemble a hexagonal lattice of carbon rolled into a cylinder.

Besides exhibiting intriguing quantum behaviors even at room temperature, nanotubes exhibit at least two important characteristics; a nanotube can be either metallic or semiconducting depending on its chirality, i.e., conformational geometry. Metallic nanotubes can carry an extremely large current density with constant resistivity. Semiconducting nanotubes can be electrically switched "on" or "off" as field effect transistors (FETs). These characteristics point to nanotubes as excellent materials for making nanometer sized semiconductor circuits.

Carbon based nanotubes are thus becoming strategically important for post-scaling of conventional semiconductor technologies. For example, a conventional CMOS or BiCMOS process requires providing an n-well to place the pFET. A pFET device, like its nFET counterpart, is typically formed with a lateral source-channel-drain arrangement. Drawbacks in such technologies include pFET device performance lagging the nFET due to lower mobility and separation requirements between the nFET and the pFET due to necessary well boundaries.

Additionally, in some dense static random access memory (SRAM) cells, pFET load devices have been formed in polysilicon layers over the SRAM nFET to make the cell size small. However, pFET device performance and process complexities to form the stacked polysilicon pFET are drawbacks in such devices.

In view of the drawbacks mentioned above with prior art semiconductor structures, there is a need to provide a hybrid semiconductor structure including a planar semiconductor device in which a horizontal carbon nanotube transistor has been integrated therein improving the performance of the structure, while shrinking the overall size of the structure.

SUMMARY

The present invention overcomes the drawbacks with prior art semiconductor devices by integrating a horizontal carbon nanotube transistor with a planar horizontal semiconductor device such as a FET in which the carbon nanotube transistor and the planar semiconductor device have a shared gate. The hybrid semiconductor structure of the present invention exhibits the performance enhancement of carbon nanotube transistors over comparably sized Si-based devices. Moreover, the inventive structure has improved packing density as compared with conventional Si-based devices. That is, the inventive structure, in which the carbon nanotube transistor shares a gate with a conventional planar semiconductor device, greatly reduces the horizontal area taken up by two separate devices.

In broad terms, the present invention provides a hybrid semiconductor structure that comprises at least one horizontal carbon nanotube transistor and at least one planar semiconductor device, said at least one horizontal carbon nanotube transistor and said at least one planar semiconductor device have a shared gate and said at least one horizontal carbon nanotube transistor is located above said shared gate.

In addition to providing the aforementioned semiconductor structure, the present invention also provides a method of forming the same. Specifically, the method of the present invention comprises:

providing a structure comprising at least one planar semiconductor device that has a gate conductor; and forming a carbon nanotube transistor on a surface of said gate conductor whereby the gate conductor of said at least one planar semiconductor device is shared with said carbon nanotube transistor.

BRIEF DESCRIPTION OF THE DRAWINGS

The drawings of the present invention, which illustrate the basic processing flow, are shown in three different views. In each of the drawings, drawing "A" represents a top-down view; drawing "B" represents a cross sectional view through x-x', and drawing "C" represents a cross sectional view through y-y'.

DETAILED DESCRIPTION

Figure 1A:
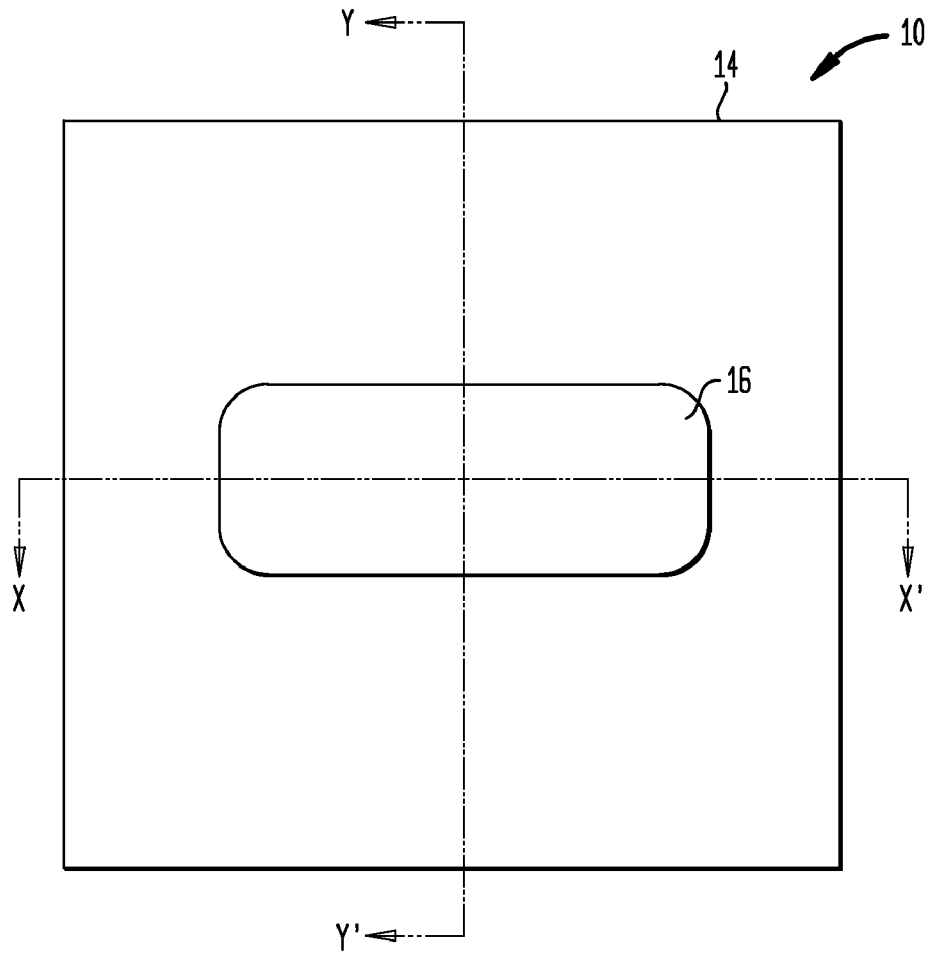
FIGS. 1A-1C are pictorial representations (through different views) illustrating an initial structure that includes a semiconductor substrate, a pad stack and a patterned resist which is used in the present invention.

The present invention, which provides a semiconductor structure in which a planar semiconductor device and a horizontal carbon nanotube transistor have a shared gate and a method of fabricating the same, will now be described in greater detail by referring to the drawings that accompany the present application. The drawings of the present invention are provided for illustrative purposes and thus they are not drawn to scale.

It is noted that the drawings of the present invention represent an embodiment in which the planar semiconductor device is a field effect transistor. Although such an embodiment is described and illustrated, the present invention also contemplates using other planar semiconductor devices which include an upper conductive layer.

Figure 1B:
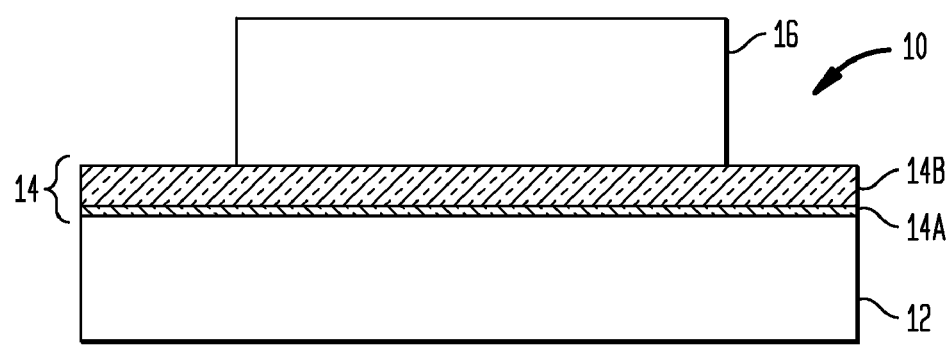
Figure 1C:
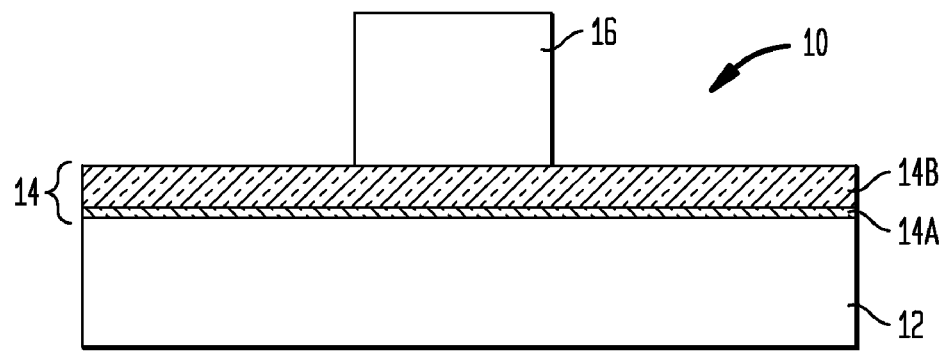

Reference is first made to the initial structure 10 shown in FIGS. 1A-1C. As shown in the different views, the initial structure 10 includes a semiconductor substrate 12, a pad stack 14 located on a surface of the semiconductor substrate 12 and a patterned resist 16 located on a portion of the pad stack 14.

The semiconductor substrate 12 includes a semiconductor material such as, for example, Si, SiGe, SiC, SiGeC, InAs, InP, GaAs, a silicon-on-insulator, a silicon germanium-on-insulator or other like semiconductor materials. Typically, the semiconductor substrate 12 includes a Si-containing semiconductor material such as single crystal Si. The semiconductor substrate 12 may be doped or undoped. Also, the semiconductor substrate 12 may be strained, unstrained or a combination thereof. The top surface of the semiconductor substrate 12 may have any major or minor Miller index including, for example, {110}, {100}, or {111}. In some embodiments, the semiconductor substrate 12 may be a hybrid semiconductor substrate having at least two planar surfaces of different crystallographic orientation.

The pad stack 14 includes at least two material layers selected from an oxide, nitride or oxynitride. Typically, the pad stack 14 comprises a lower oxide layer 14A and an upper nitride layer 14B. The pad stack 14 can be formed utilizing conventional deposition processes such as, for example, chemical vapor deposition (CVD), plasma enhanced chemical vapor deposition (PECVD), evaporation, chemical solution deposition, atomic layer deposition or other like deposition processes. Alternatively, the pad stack 14 can be formed by a thermal process such as, for example, thermal oxidation or thermal nitridation. In some embodiments, the pad stack 14 can be formed by a combination of deposition and/or thermal processes.

The thickness of the pad stack 14 may vary depending on the number of material layers within the stack. Typically, the lower oxide layer 14A of the pad stack 14 has a thickness from about 2 to about 20 nm, and the upper nitride layer 14B of the pad stack 14 has a thickness from about 50 to about 150 nm.

After forming the pad stack 14, the patterned resist 16 is formed atop the pad stack 14 by first applying a resist material on the pad stack 14 utilizing a conventional deposition process such as, for example, spin-on coating, and then subjecting the applied resist material to lithography including exposing the resist to a desired pattern of radiation and developing the exposed resist utilizing a conventional resist developer. A negative-tone or positive-tone resist material can be used in the present invention.

Figure 2A:
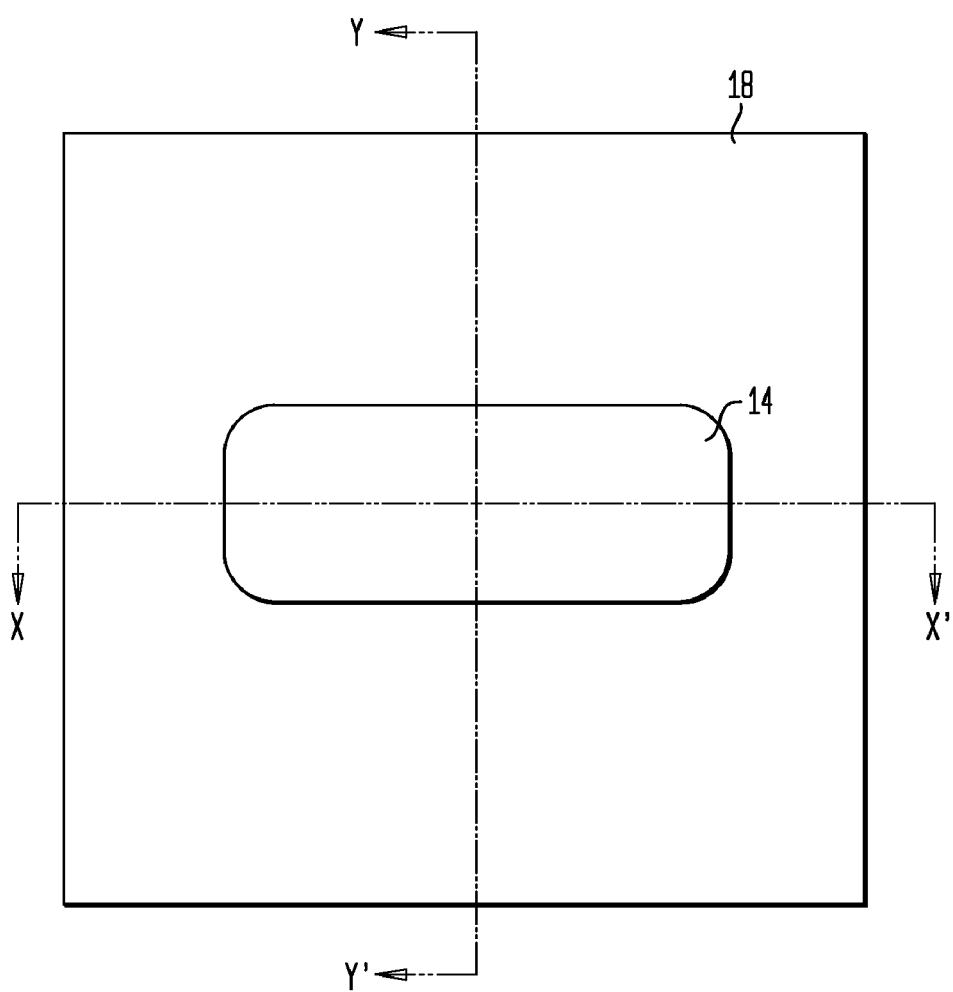
FIGS. 2A-2C are pictorial representations (through different views) showing the structure after forming trench isolation regions.
Figure 2B:
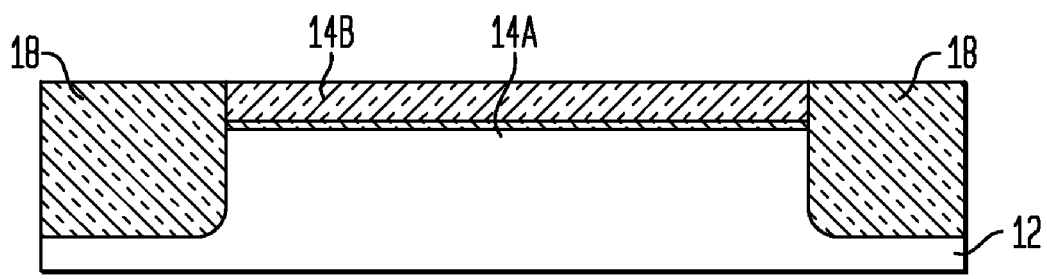
Figure 2C:
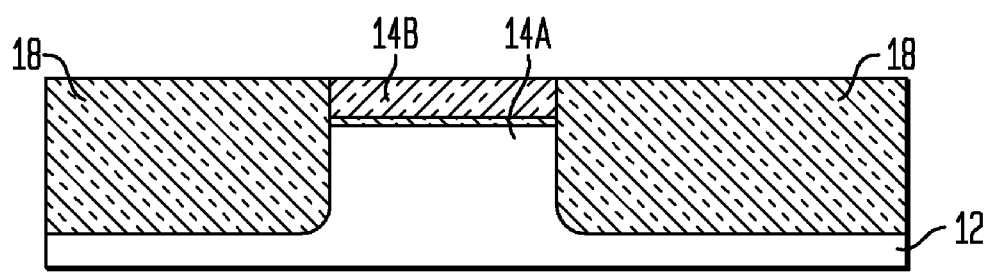

Next, and as shown in FIGS. 2A-2C, trench isolation regions 18 are formed into the structure 10 by etching exposed portions of the pad stack 14 and then portions of the underlying semiconductor substrate 12, stripping the patterned resist 16, and filling the etched openings with a trench dielectric material. A planarization process, such as chemical mechanical polishing (CMP) or grinding, may follow the trench fill.

The etching used in providing the trench isolation openings typically comprises a dry etching process such as, for example, reactive ion etching (RIE). In some embodiments of the present invention, a wet chemical etching process can be used in providing the trench isolation openings. In yet other embodiments, a combination of any dry etching and/or wet etching technique can be used. The exposed trench surface can be passivated by thermally grown oxide on the bare walls prior to filling the openings with a trench dielectric material.

The trench dielectric material typically comprises an oxide and a deposition process such as CVD, PECVD or chemical solution deposition can be used to fill the trench openings. In yet other embodiments of the present invention, the trench dielectric may be subjected to a densification process. Note that the trench isolation regions 18 have an upper surface that is substantially coplanar with an upper surface of the pad stack 14. This coplanar surface may be achieved by performing a conventional planarization process such as, for example, chemical mechanical polishing and/or, grinding, after the trench fill step.

After forming the trench isolation regions 18, the pad stack 14 (including lower oxide layer 14A and upper nitride layer 14B) is removed utilizing a conventional stripping process and then a gate dielectric 20 is formed. Note that during stripping of the lower oxide layer 14A of the pad stack 14 portions of the trench isolation regions 18 that extend above the upper surface of the semiconductor substrate 12 are removed. Thus, after stripping of the pad stack 14, the upper surface of the trench isolation regions 18 is now substantially coplanar with an upper surface of the semiconductor substrate 12.

Figure 3A:
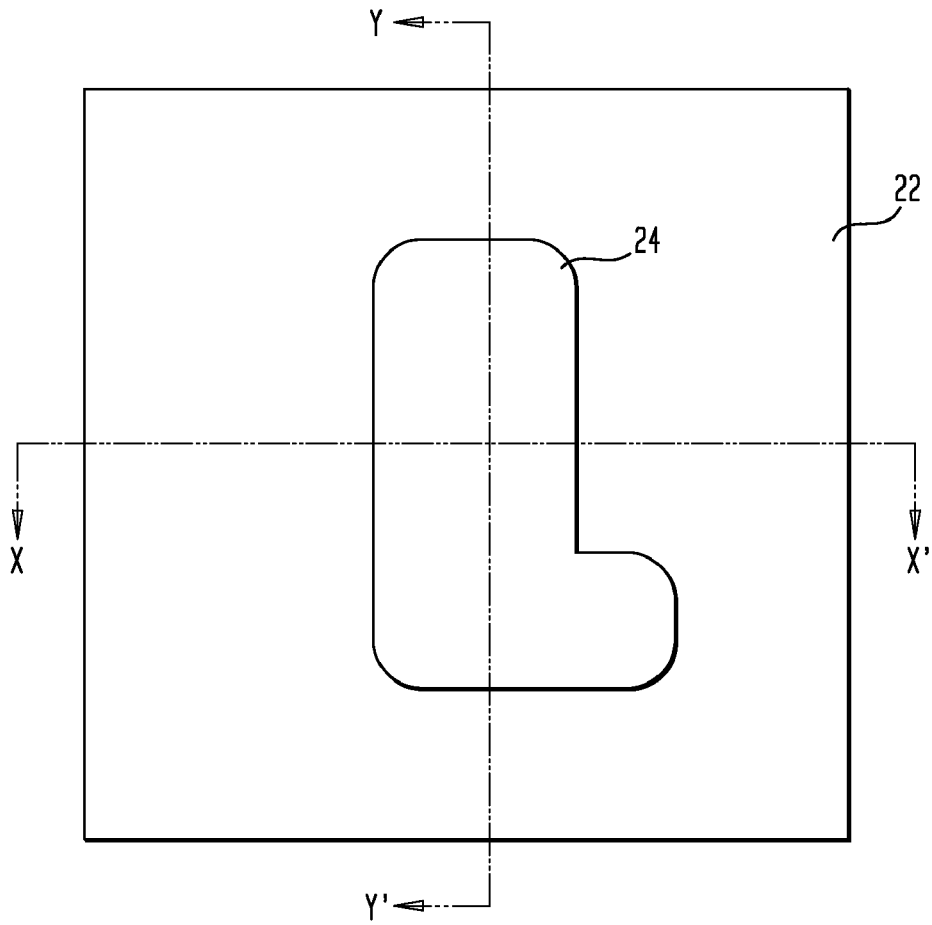
FIGS. 3A-3C are pictorial representations (through different views) showing the structure after gate conductor deposition and formation of a patterned gate resist atop the gate conductor.
Figure 3B:
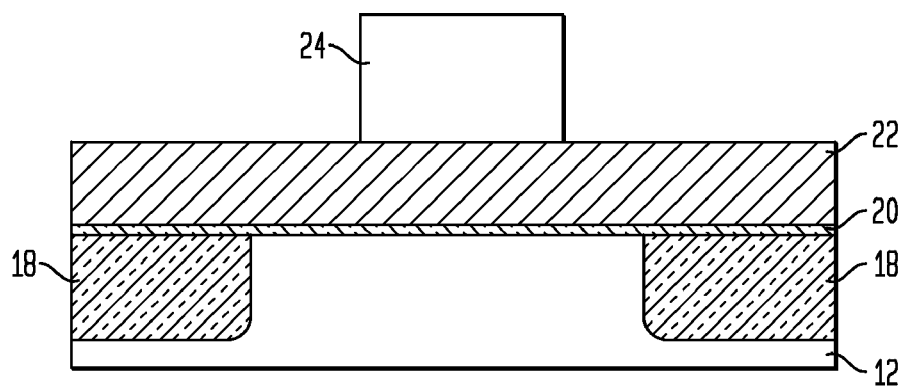
Figure 3C:
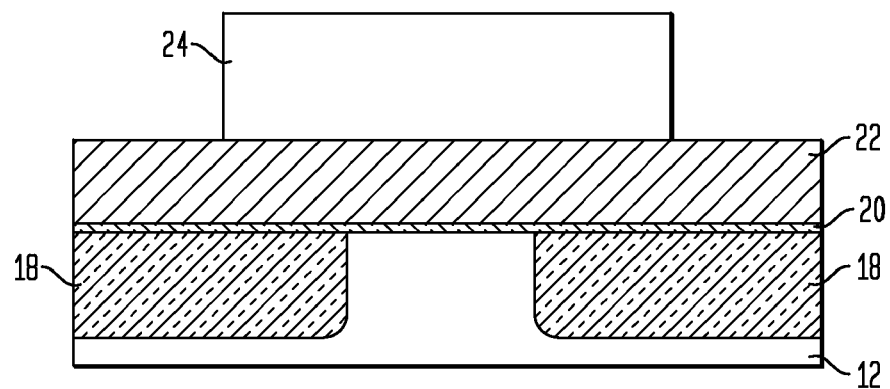

The gate dielectric 20 can be located atop the semiconductor substrate 12 or, if it is a deposited oxide, it can extend atop the trench isolation regions 18 as well. The later embodiment is depicted in FIGS. 3A-3C. The gate dielectric 20 is comprised of an oxide, nitride, oxynitride or a combination, including multilayers thereof. Preferably, the gate dielectric 20 may be a silicon oxynitride formed by thermally growing $SiO_2$ followed by plasma nitridation. Alternatively, the gate dielectric 20 may be formed by a deposition process such as CVD, PECVD, chemical solution deposition, atomic layer deposition or other like deposition processes. Combinations of the aforementioned techniques can also be used in forming the gate dielectric 20. Gate dielectric 20 typically has a thickness from about 1 to about 3 nm.

After forming the gate dielectric 20, a gate conductor 22 is formed atop the gate dielectric 20 (see, FIGS. 3A-3C as well).

The gate conductor 22 is comprised of a conductive material such as doped poly-crystalline (or poly) Si, doped poly SiGe, a metal, a metal alloy, a metal silicide, a metal nitride or multilayers thereof. Typically, the gate conductor 22 is comprised of polysilicon. The gate conductor 22 is formed utilizing a conventional deposition process including, for example, CVD, PECVD, sputtering or other like deposition processes. The thickness of the gate conductor 22 may vary depending on the type of conductive material employed as well as the technique used in forming the same. Typically, the poly Si gate conductor 22 has a thickness from about 50 to about 150 nm.

A resist material is then applied atop the gate conductor 22 and thereafter it is patterned using conventional lithography. The patterned resist material is labeled as reference numeral 24 in FIGS. 3A-3C and it serves as the gate mask 24 in the inventive process.

Figure 4A:
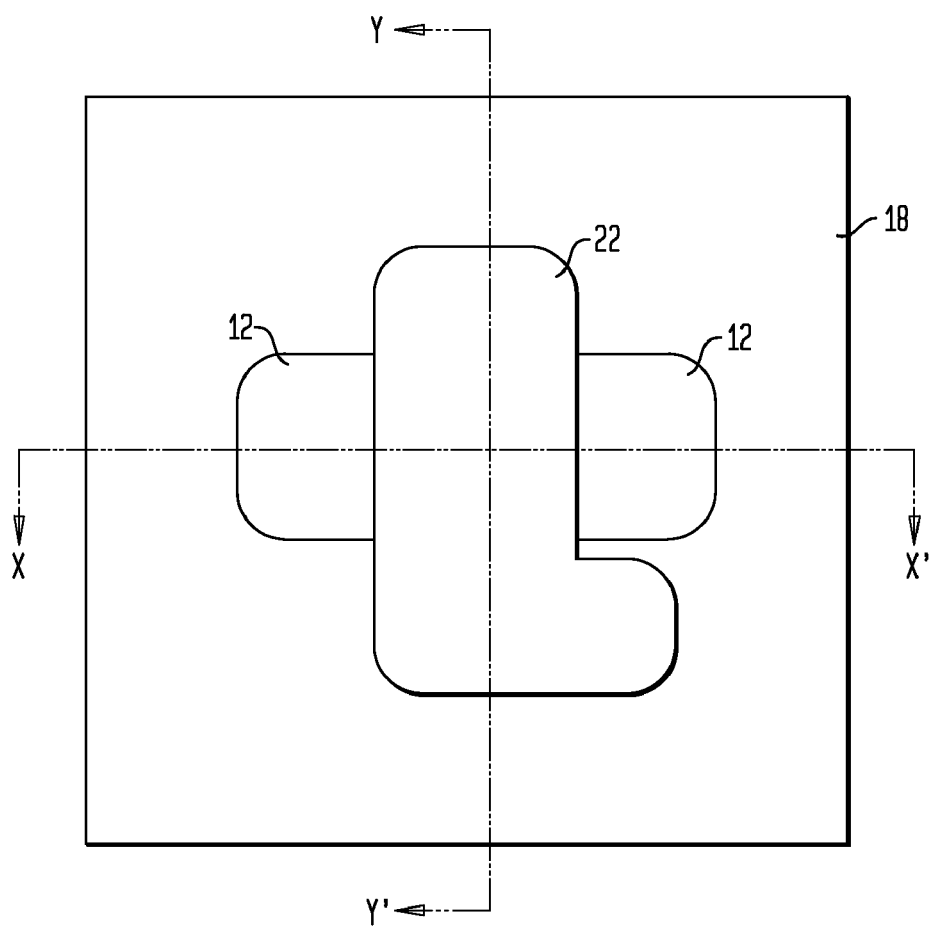
FIGS. 4A-4C are pictorial representations (through different views) showing the structure after etching of the gate conductor and removal of the patterned gate resist.
Figure 4B:
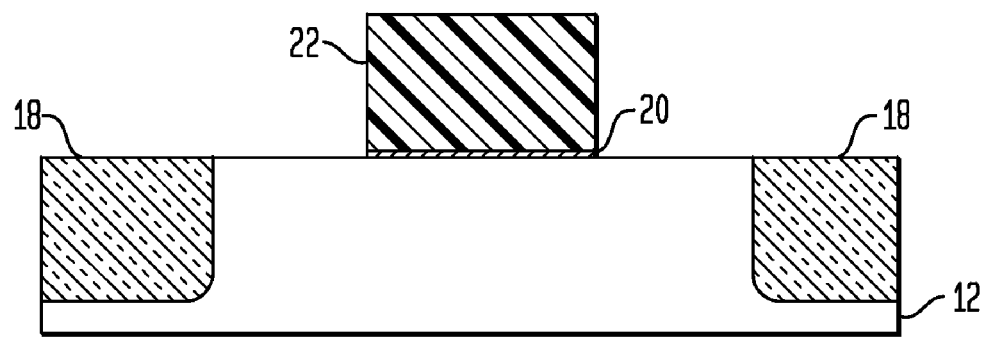
Figure 4C:
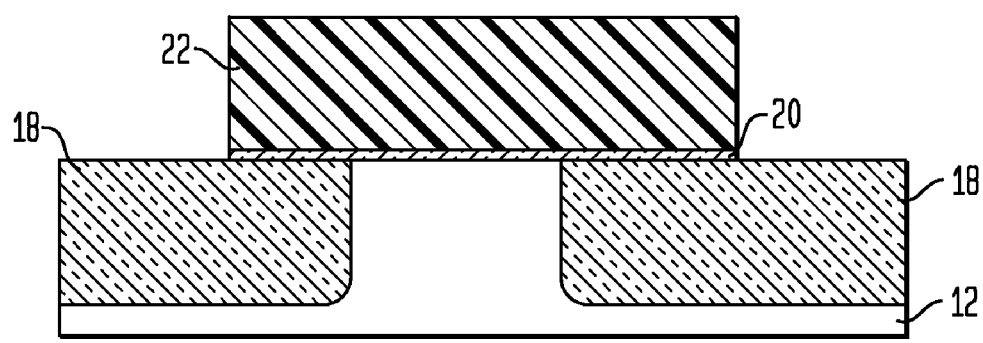

Next, and as shown in FIGS. 4A-4C, at least the gate conductor 22 and optionally the gate dielectric 20, not protected by the gate mask 24, can be removed utilizing one or more etching processes. In the embodiment illustrated, the gate dielectric 20 underlying the non-protected gate conductor 22 is removed. The etching step used at this point of the inventive process includes a dry etching process such as RIE, a chemical wet etch process or a combination thereof. The etch is selective for removing at least the gate conductor 22. After etching, the gate mask 24 is removed utilized a conventional resist stripping process well known to those skilled in the art.

Figure 5A:
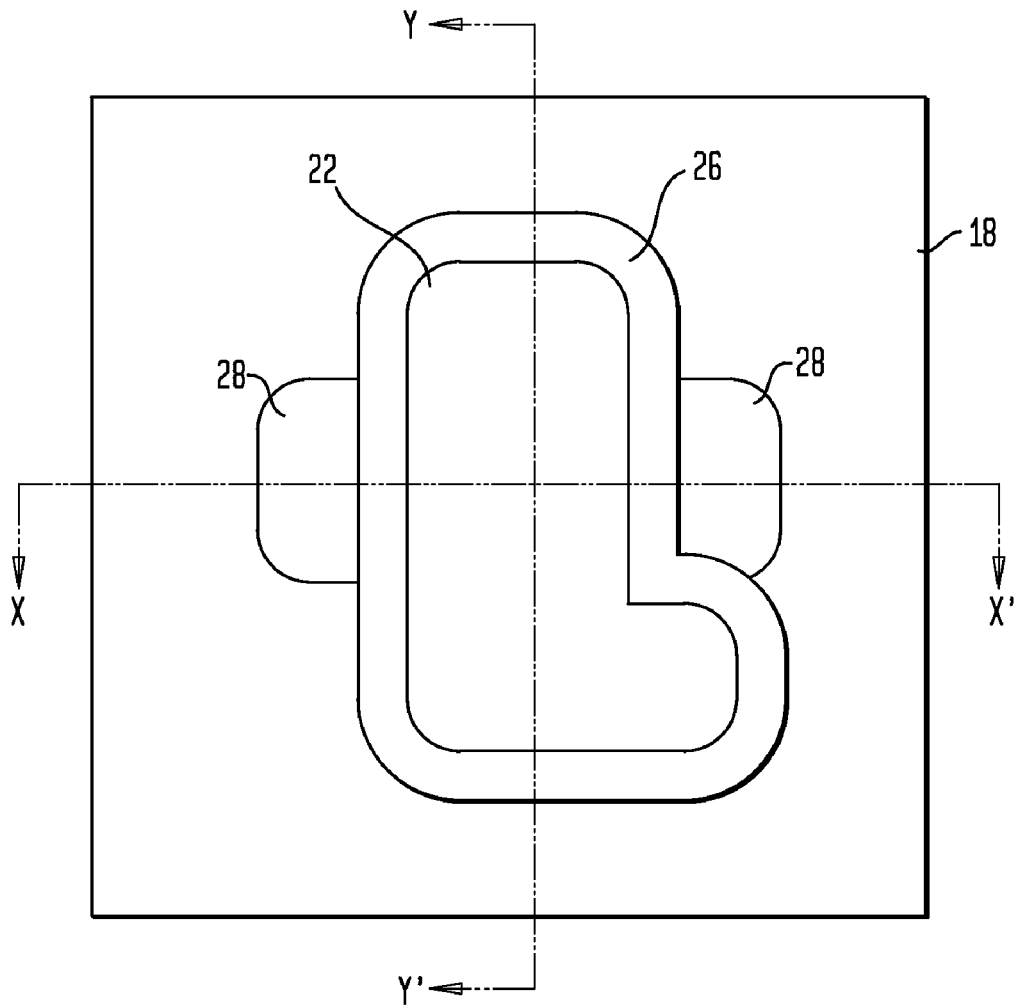
FIGS. 5A-5C are pictorial representations (through different views) showing the structure after spacer formation and dopant implantation.
Figure 5B:
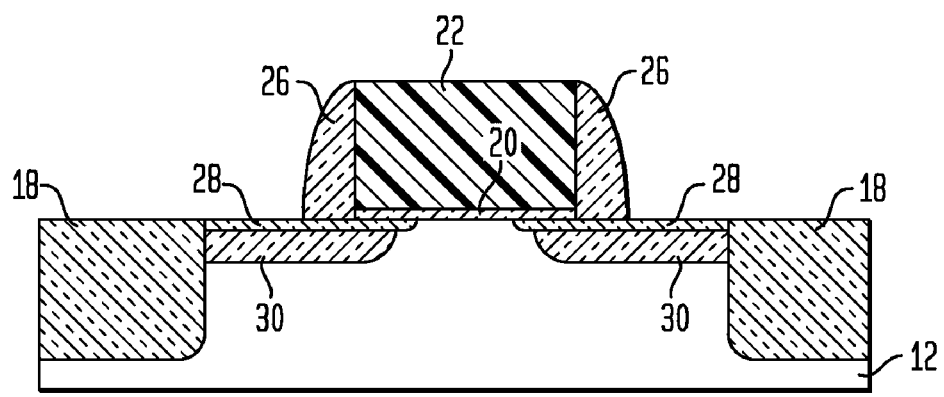
Figure 5C:
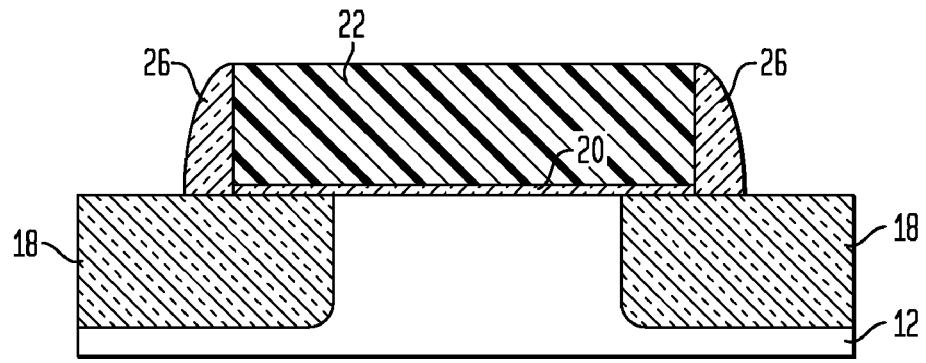

FIGS. 5A-5C shows the structure after formation of at least one spacer 26 on at least exposed sidewalls of the gate conductor 22. The at least one spacer 26 comprises an oxide, a nitride, oxynitride or any combination thereof including multilayers. The structure shown in FIGS. 5A-5C also includes source/drain extension regions 28 and source/drain diffusion regions 30 that are formed by ion implantation and annealing. The source/drain extensions 28 are typically implanted prior to spacer formation, while the source/drain diffusion regions 30 are formed after spacer formation. A single anneal step can be used to activate both implant regions, or separate anneals can be used. The dopants for source and drain extensions 28 and diffusions 30 are also implanted into the gate poly Si (e.g., conductor 22) and activated by the activation anneal.

Figure 6A:
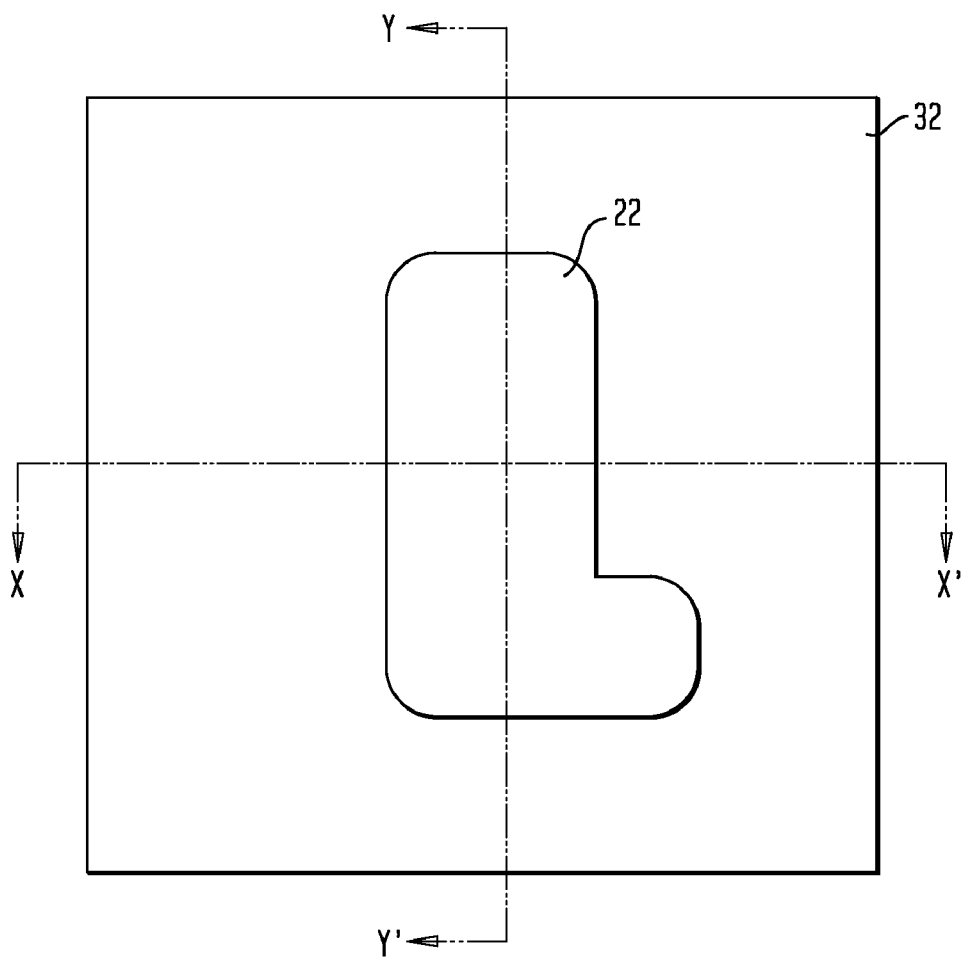
FIGS. 6A-6C are pictorial representations (through different views) showing the structure after formation of a planarizing dielectric.
Figure 6B:
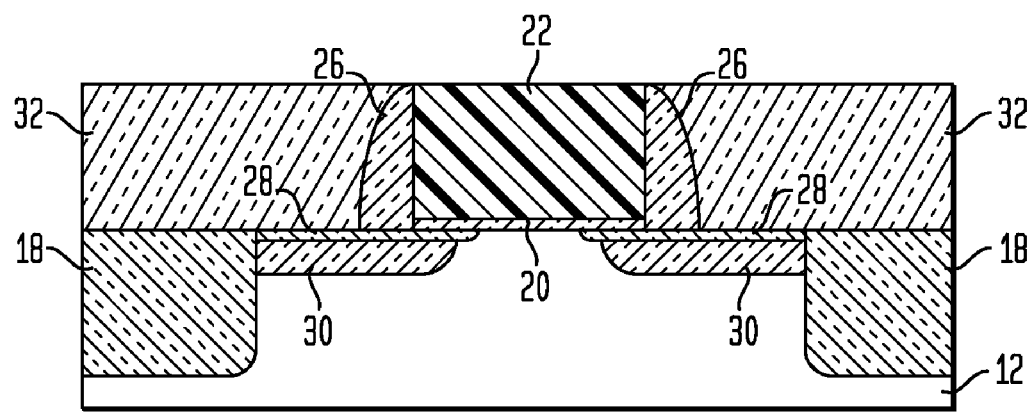
Figure 6C:
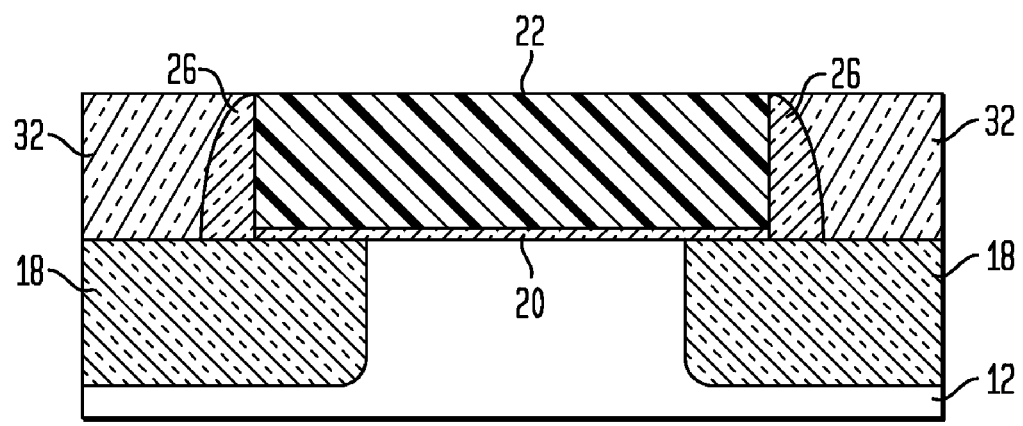

After completely fabricating the planar semiconductor device, a planarizing dielectric 32 is formed to provide the structure shown, for example, in FIGS. 6A-6C. The planarizing dielectric 32 is formed by a conventional deposition process such as, for example, CVD or PECVD, and planarization is achieved by CMP (chemical mechanical polishing). As shown, the planarizing dielectric 32 has an upper surface that is substantially coplanar with an upper surface of the gate conductor 22.

The planarizing dielectric 32 is comprised of any dielectric material including, for example, a silicon dioxide, silicon nitride or silicon oxynitride. Typically, the planarizing dielectric 32 is an oxide.

A gate dielectric 34 for the carbon nanotube transistor (CNT) (See, FIGS. 7A-7C) is then formed on the exposed surface of the planarized gate conductor 22. The gate dielectric 34 can be formed by a deposition process such as, for example, CVD, PECVD, atomic layer deposition (ALD), chemical solution deposition or other like deposition processes. The gate dielectric 34 may also be formed utilizing any combination of the above processes.

The CNT gate dielectric 34 is comprised of an insulating material including, but not limited to: a silicon dioxide, silicon nitride, silicon oxynitride and/or silicate including metal silicates and nitrided metal silicates. In one embodiment, it is preferred that the CNT gate dielectric 34 is comprised of an oxide such as, for example, $SiO_2$, $HfO_2$, $ZrO_2$, $Al_2O_3$, $TiO_2$, $La_2O_3$, $SrTiO_3$, $LaAlO_3$ or multilayers thereof.

The physical thickness of the CNT gate dielectric 34 may vary, but typically, the CNT gate dielectric 34 has a thickness from about 1.0 to about 10 nm.

After forming the CNT gate dielectric 34, a CNT seed layer, i.e., catalyst, 35 for the growth of a carbon nanotube is formed on the exposed surface of the CNT gate dielectric 34. The catalyst 35 is formed utilizing a conventional deposition process such as chemical vapor deposition (CVD), plasma enhanced chemical vapor deposition (PECVD) physical vapor deposition (PVD) or other like deposition processes. The catalyst 35 comprises a Group VIII transition metal such as Ni, Co or Fe, or alloys thereof. The catalyst 35 formed has a thickness that is typically from about 1 to about 10 nm. In some embodiments of the present invention, a thin dielectric layer (not shown) such as silicon dioxide or silicon nitride having a thickness of about 1 to about 5 nm is deposited over the catalyst 35. After deposition, the catalyst 35 and the optional overlaying dielectric are patterned by lithography and etching.

The patterned catalyst 35 serves to define the location, diameter and possibly other attributes of the carbon nanotube.

Figure 7A:
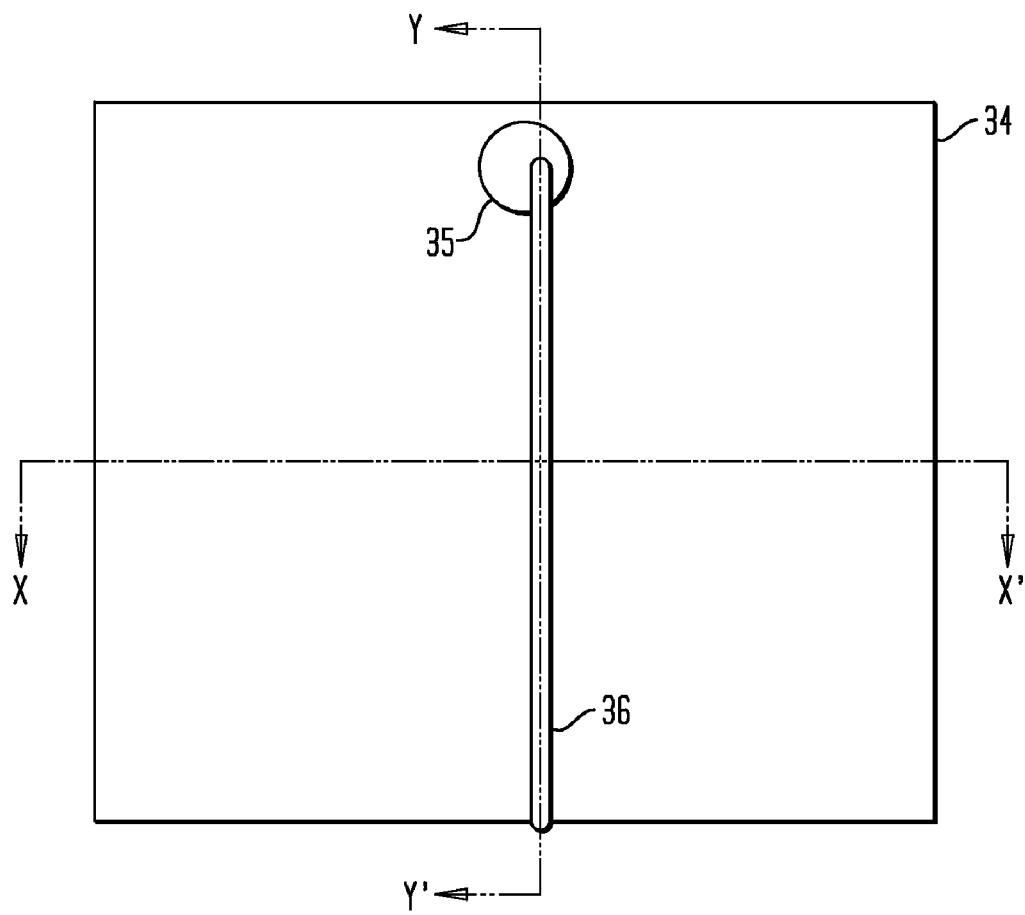
FIGS. 7A-7C are pictorial representations (through different views) showing the structure after formation of a carbon nanotube transistor dielectric, and growth of a carbon nanotube material from a patterned carbon nanotube seed layer.
Figure 7B:
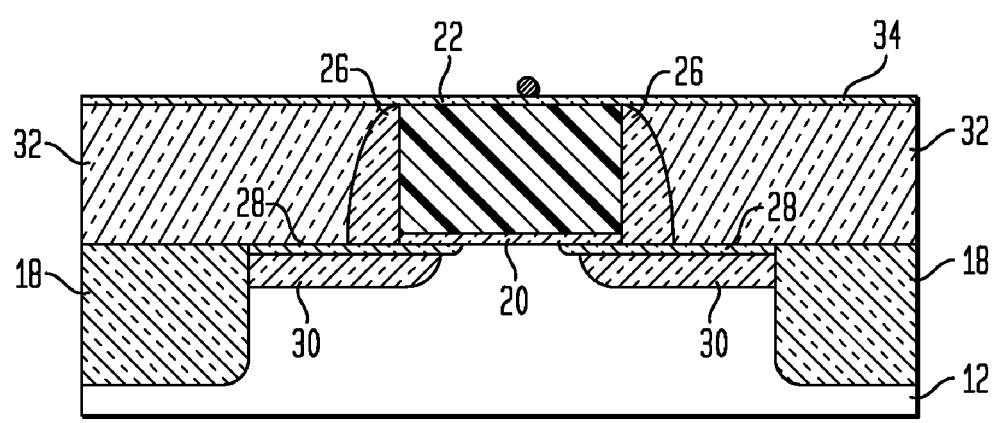
Figure 7C:
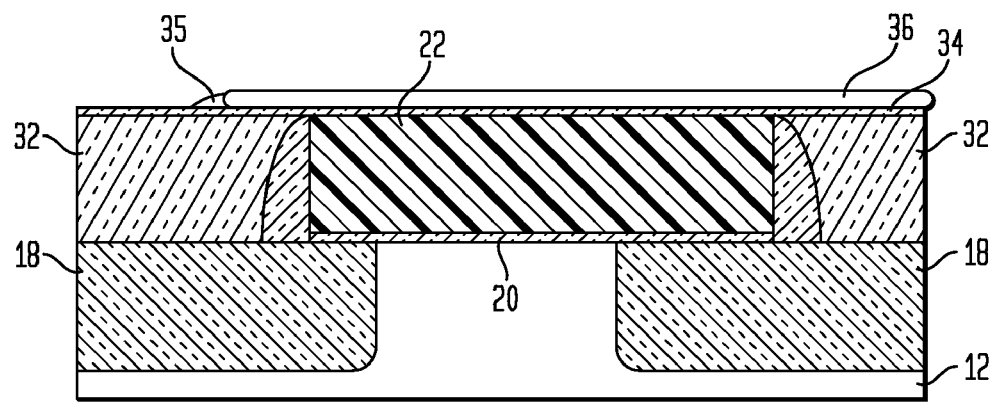

The structure shown in FIGS. 7A-7C also shows the presence of at least one carbon nanotube 36. The at least one carbon nanotube 36 is formed by growing the nanotube from the surface of catalyst 35 using techniques that are well known in the art. Each carbon nanotube 36 that is formed has a hollow cavity with nanometer-sized diameters and lengths of up to a few micrometers. In other words, the nanotubes 36 have a high aspect ratio and quantum effects become important for these systems.

The nanotubes 36 that can be used in the present invention are preferably single walled semiconductive nanotubes that have an outer diameter that is typically from about 0.8 nm to about 5 nm, with an outer diameter from about 1.0 nm to about 2.5 nm being more typical, and a length that is typically less than about 5 μm. A single semiconductor nanotube 36, or alternatively a plurality of semiconductor nanotubes 36 is formed.

As indicated above, the nanotubes 36 are formed utilizing techniques that are known in the art. For example, carbon-based nanotubes 36 can be made by chemical vapor deposition in the presence of metallic particles, e.g., the catalyst previously formed. Specific process details for nanotube 36 formation that can be used in the present invention can be found, for example, in S. Iijima, et al. "Helical Microtubes of Graphite Carbon", Nature 354, 56 (1991); D. S. Bethune, et al. "Cobalt Catalyzed Growth of Carbon Nanotubes with Single-Atomic-Layer Walls" Nature 363, 605 (1993), and R. Saito, et al. "Physical Properties of Carbon Nanotubes", Imperial College Press (1998); the entire content of each is incorporated herein by reference. In one embodiment of the present invention, a single or multiple semiconductor carbon nanotube 36 is formed by chemical vapor deposition at 900° C. for 10 min using an Fe catalyst.

As an alternative embodiment to the one discussed above, carbon nanotubes may be applied to the surface of CNT gate dielectric 34 after fabricating and sorting semiconductive CNT elsewhere. Currently, carbon nanotubes can be commercially purchased suspended in a casting liquid. This suspension can be applied to the surface of CNT gate dielectric 34, and the liquid removed via evaporation. The remaining layer of carbon nanotubes 36 can then be patterned by a conventional lithography and etching technique.

In a highly preferred embodiment of the present invention, the subsequent carbon nanotube transistor (CNT) is a pFET. In other embodiments of the present invention (which are less preferred), the CNT may be formed into a nFET by subjecting the CNT to an annealing step that is capable of removing oxygen from the CNT. The annealing step, which is capable of removing oxygen from the CNT, is typically performed in a heated vacuum (IEEE Proceedings, Avouris, November 2003 p 1780).

After growing the carbon nanotubes 36, a CNT protective dielectric 40 is formed over the entire length of the structure shown in FIGS. 7A-7C. The CNT protective dielectric 40 comprises silicon dioxide, silicon nitride or silicon oxynitride, with the nitride being most typical. The CNT protective dielectric 40 is formed by a conventional deposition process such as CVD or PECVD. The CNT protective dielectric 40 has a thickness that is typically from about 50 to about 200 nm.

A CNT trim mask 42 is then formed on the CNT protective dielectric 40 by a conventional process such as spin-on coating and then the CNT trim mask 42 is patterned by lithography. The CNT trim mask protects portions of the CNT protective dielectric 40, while exposing other portions of CNT protective dielectric 40. The exposed CNT protective dielectric 40 together with the underlying carbon nanotube 36 are then removed by an etching process stopping atop the CNT gate dielectric 34.

Figure 8A:
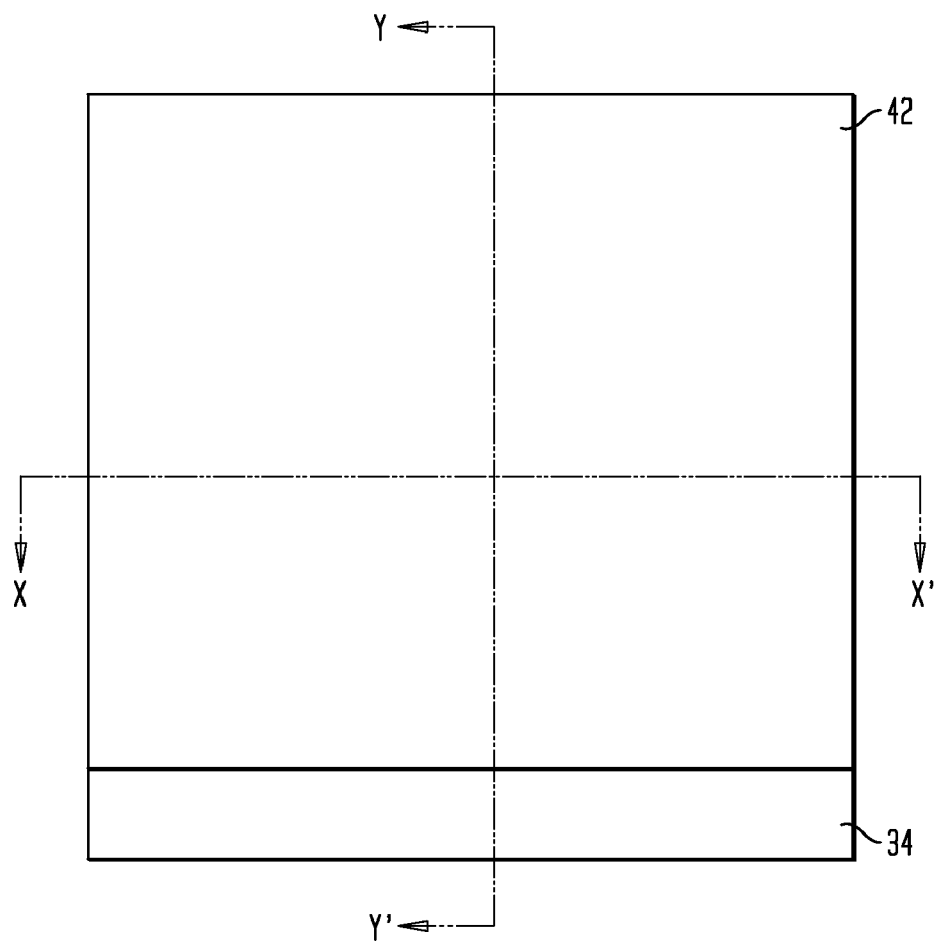
FIGS. 8A-8C are pictorial representations (through different views) showing the structure after forming a carbon nanotube transistor protective dielectric, providing a carbon nanotube transistor trim mask and etching.
Figure 8B:
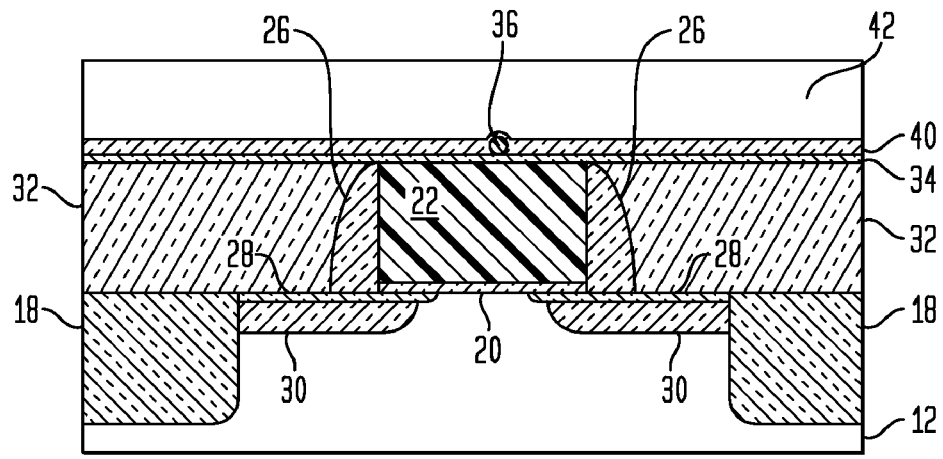
Figure 8C:
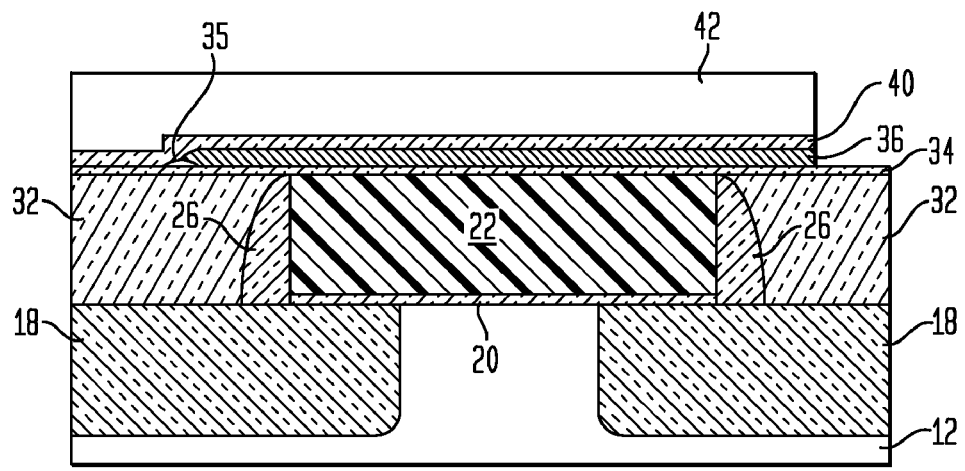
Figure 9A:
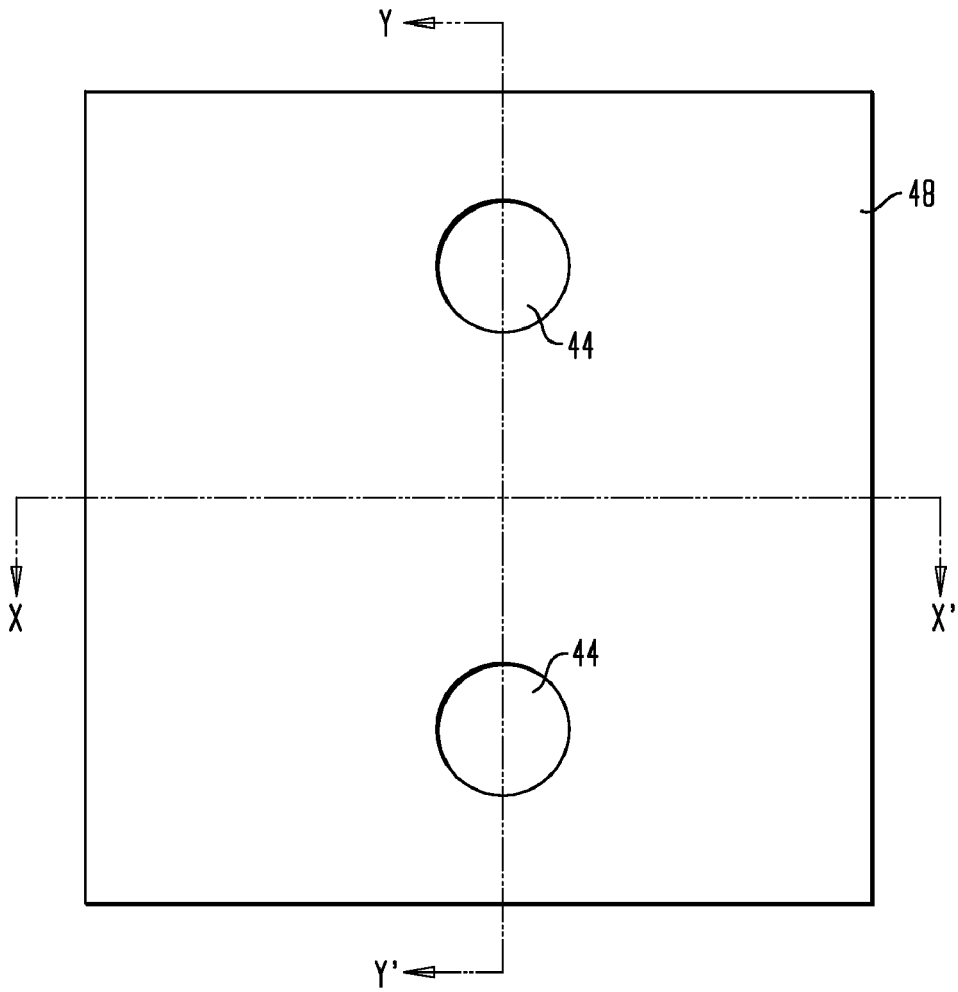
FIGS. 9A-9C are pictorial representations (through different views) showing the structure after stripping the trim mask, forming a dielectric film, forming a protective dielectric layer and forming a carbon nanotube transistor contact mask.
Figure 9B:
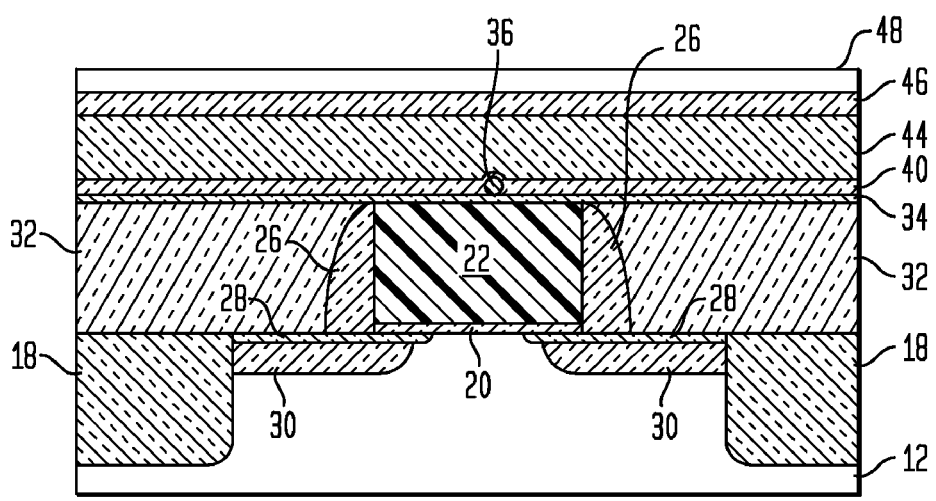
Figure 9C:
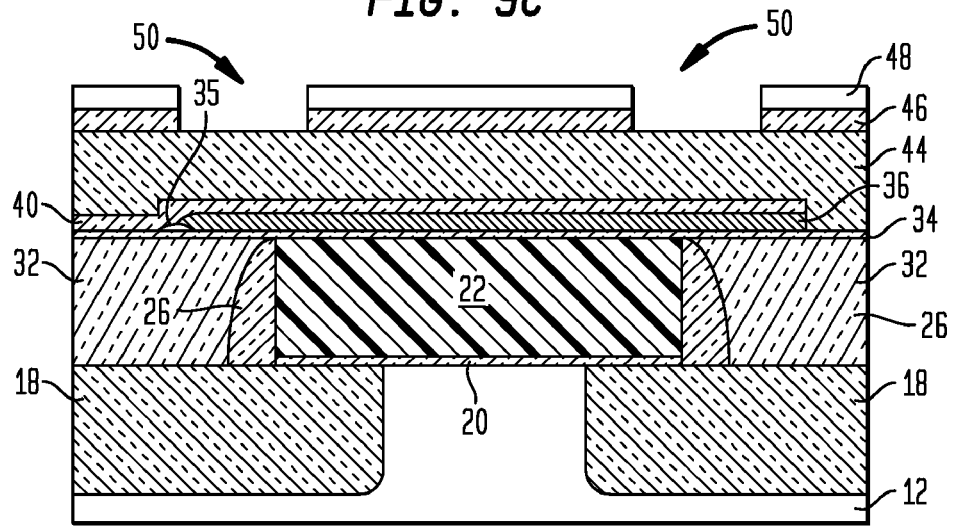

The resultant structure including the CNT protective dielectric 40, CNT trim mask 42 and exposed CNT gate dielectric 34 is shown, for example, in FIGS. 8A-8C. After providing the structure shown in FIGS. 8A-8C, the CNT trim mask 42 is removed from the structure and another dielectric layer 44 such as silicon dioxide or silicon oxynitride is then applied by a conventional deposition process such as, for example, CVD or PECVD. Next, a dielectric protective material layer 46 is formed atop the dielectric 44 utilizing a conventional deposition process such as, for example CVD, PECVD or ALD. The dielectric protective material layer 46 comprises a silicon nitride. A CNT contact mask 48 is then applied to layer 46 and the contact mask 48 is thereafter patterned by lithography. The resultant structure including layers 44, 46 and 48 is shown, for example, in FIGS. 9A-9C. In the illustrated structure, the CNT contact mask 48 includes contact openings 50 which have been transferred to the underlying protective dielectric material 46 by an etching process for example RIE. The contact openings 50 expose a surface of the dielectric layer 44.

Figure 10A:
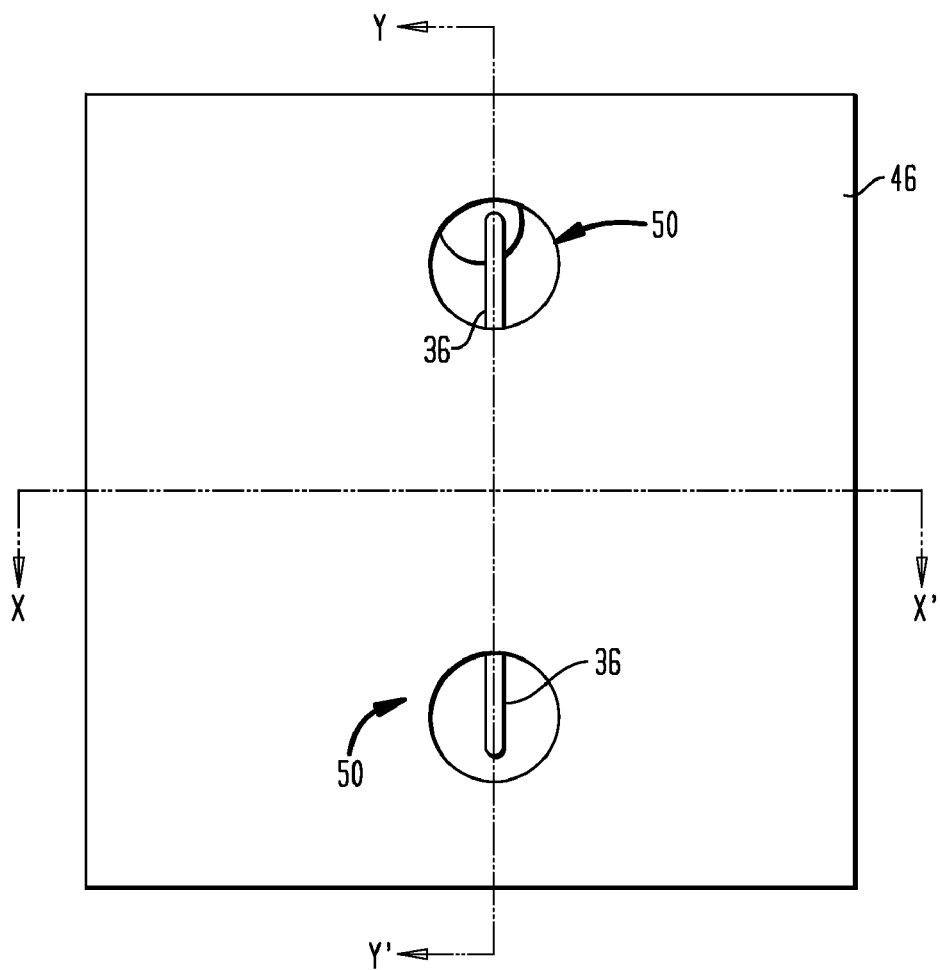
FIGS. 10A-10C are pictorial representations (through different views) showing the structure after etching the dielectric film and removing exposed portions of the carbon nanotube transistor protective dielectric.
Figure 10B:
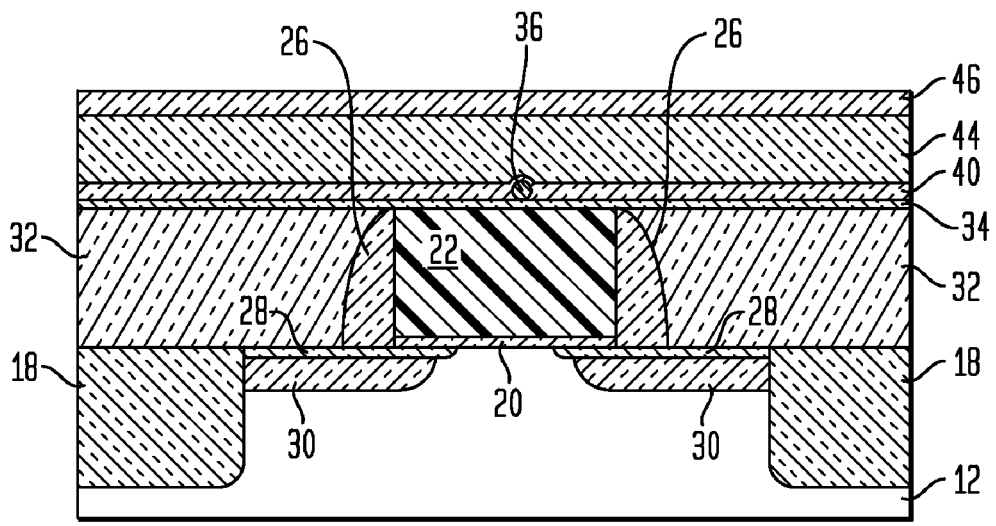
Figure 10C:
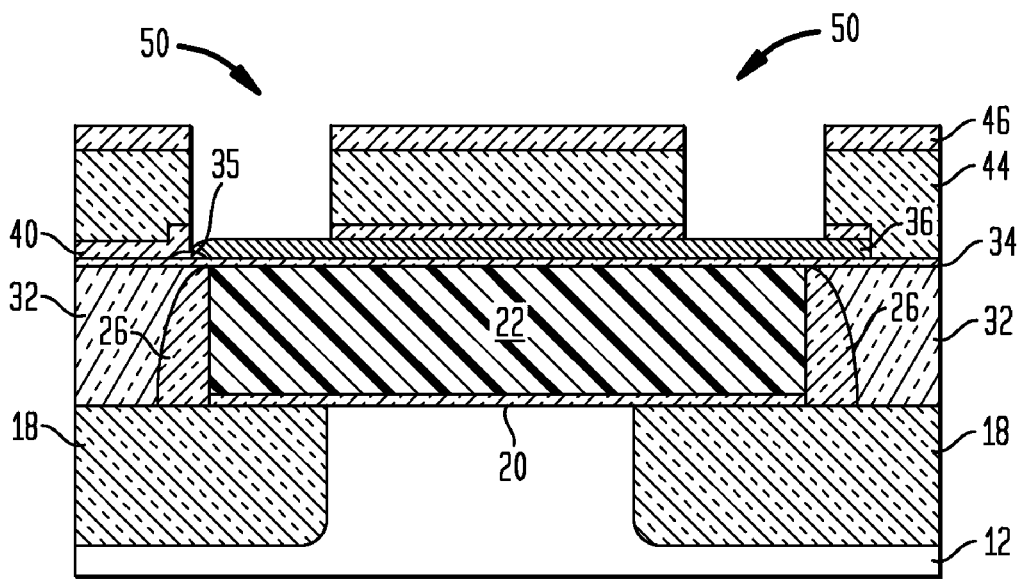

FIGS. 10A-10C show the structure after extending the contact openings 50 to expose a surface of the carbon nanotubes 36 and removal of the CNT contact mask 48. The extended contact opening now extends through dielectric layer 44 and CNT protect dielectric 40. Specifically, the contact openings are extended down through the dielectric layer 44 and the CNT protective dielectric 40 by utilizing two or more etching steps. At the end of the contact etching steps, the contact mask 48 is also etched away from the structure.

Figure 11A:
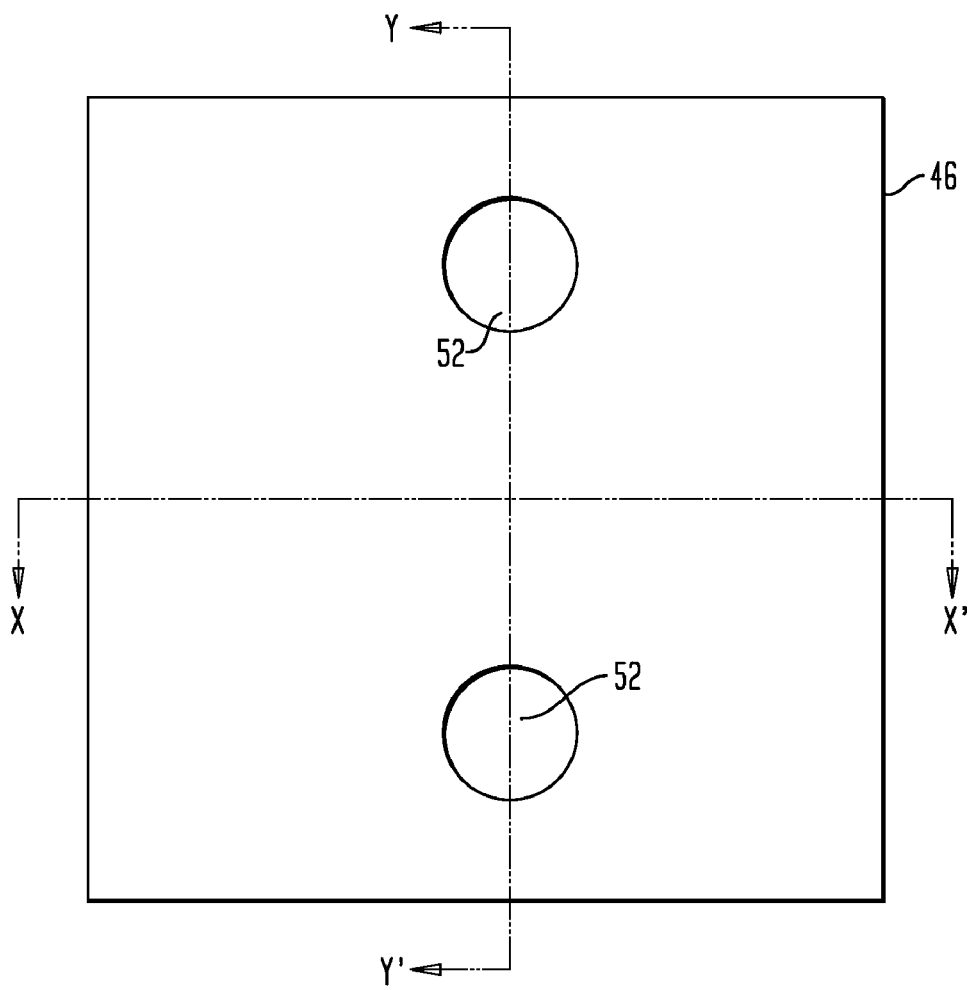
FIGS. 11A-11C are pictorial representations (through different views) showing the structure after carbon nanotube transistor contact formation and optional removing of the protective dielectric layer.
Figure 11B:
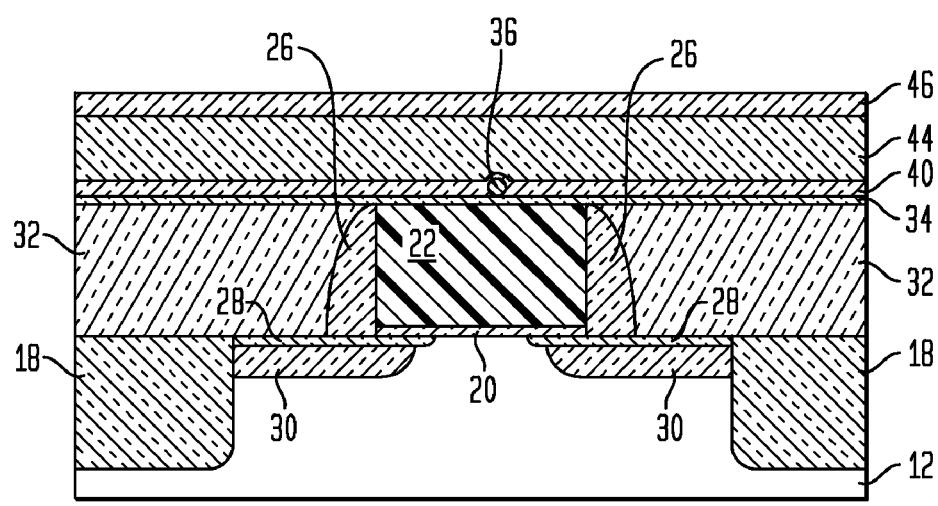
Figure 11C:
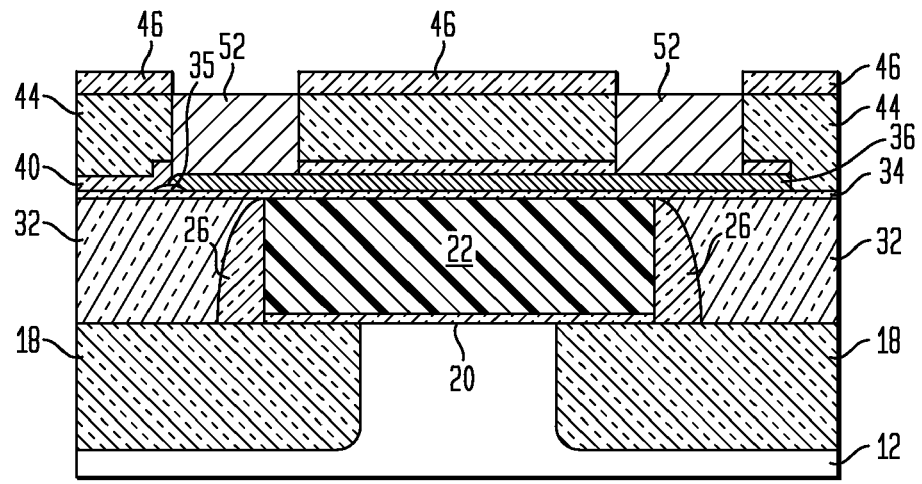

FIGS. 11A-11C show the structure after filling the contact openings with a conductive material 52 such as Ti, Co, Au, Pt or their alloys. The conductive material 52 is formed into the contact opening 50 by a conventional deposition process and then performing a damascene CMP process to remove the conductive material that extends above the contact openings. The later step does not always need to be performed. During the CMP step, a part or, all of, layer 46 is removed. The structure is then annealed at temperature from about 600° C. to about 900° C. in an inert ambient such as He, Ar or a mixture thereof to form metal-carbon alloy at the contacts.

Figure 12A:
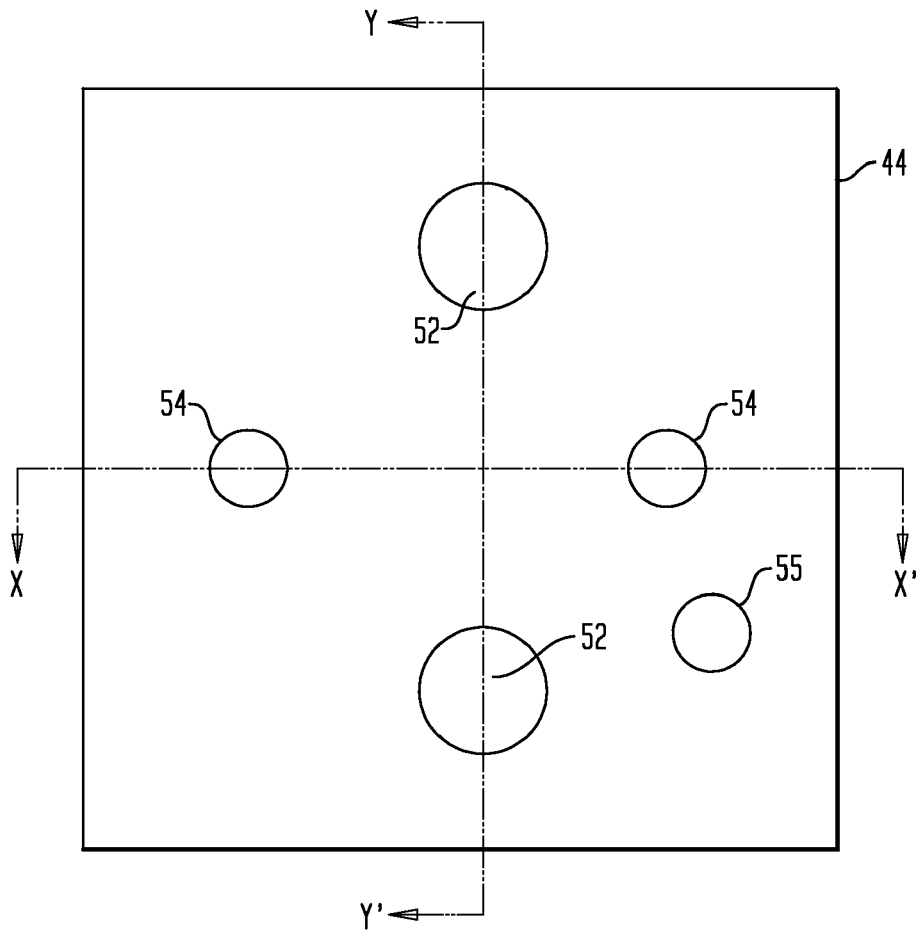
FIGS. 12A-12C are pictorial representations (through different views) showing the position of five contacts in the inventive structure.
Figure 12B:
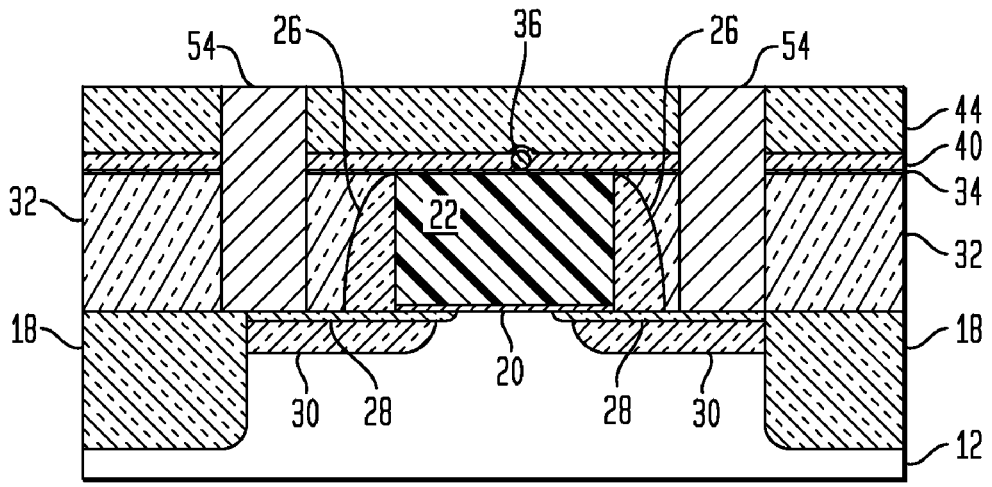
Figure 12C:
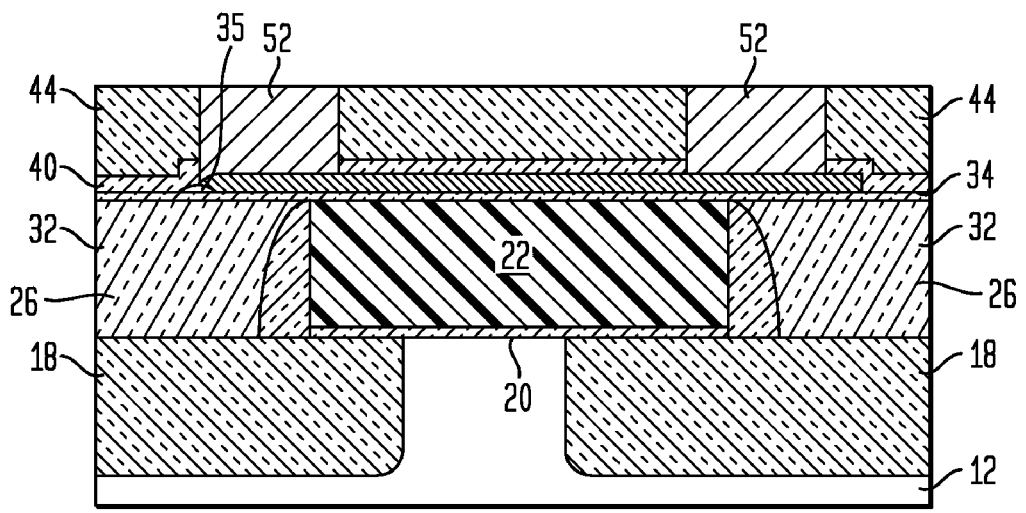

FIGS. 12A-12C shows the device structure after formation of contacts 54 to the source and drain of the planar semiconductor device and contact 55 to the shared gate conductor 22. Similarly to CNT contact formation, the source/drain contact 54 and gate contact 55 are defined lithographically and are etched into the dielectric layers 46, 44, 30, 34 and 32. The contact openings to the source/drain regions are filled with a conductive material such as W, Cu, Al or other suitable conductor. The conductive material is formed into the contact opening by a conventional deposition process and then performing a damascene CMP process to remove the conductive material that extends above the contact openings. During the CMP, a part or, all of, the remaining layer 46 is removed. In the inventive structure illustrated region 22 is the shared gate between the planar device and the horizontal CNT.

After the contact formations, CNT and Si base FET devices are wired to form ULSI circuits. For example, the drain contact of the Si nFET and the drain contact of CNT pFET can be connected to make an inverter circuit and the couple of the inverters can be connected with a couple of Si nFETs to form a six device SRAM cell.

So far the device structure has been described as having a shared gate between CNT FET and Si FET. However, if the shared gate is not required, either CNT FET or Si FET can be eliminated to form stand-alone devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a hybrid semiconductor structure comprising:
   providing a semiconductor device comprising a semiconductor substrate having a source region and a drain region separated by a channel region, a first gate dielectric that is present on the channel region and a gate conductor that is present on the first gate dielectric; and
   forming a carbon nanotube transistor comprising a second gate dielectric in direct contact with an upper surface of the gate conductor, and a carbon nanotube in direct contact with a portion of the second gate dielectric, wherein said gate conductor is shared for both the semiconductor device and the carbon nanotube transistor.

2. The method of claim 1 wherein said forming said carbon nanotube transistor comprises forming said second gate dielectric on said gate conductor, forming a patterned carbon nanotube transistor (CNT) seed layer on said second gate dielectric and growing said carbon nanotube from said patterned CNT seed layer.

3. The method of claim 2 wherein said growing said carbon nanotube comprises chemical vapor deposition.

4. The method of claim 2 wherein said carbon nanotube is semiconductive carbon nanotube.

5. The method of claim 2 wherein said carbon nanotube has an outer diameter from about 0.8 nm to about 5 nm and a length less than about 5 μm.

6. The method of claim 5 wherein said carbon nanotube has an outer diameter from about 1.0 nm to about 2.5 nm.

7. The method of claim 1 further comprising forming metal contacts to said carbon nanotube transistor.

8. The method of claim 7 wherein said metal contacts are formed within a dielectric material.

9. The method of claim 1 wherein said forming said carbon nanotube transistor comprises forming said second gate dielectric on said gate conductor, applying a suspension containing carbon nanotubes and a liquid on said second dielectric; removing said liquid and patterning said carbon nanotubes.

10. The method of claim 1 wherein said carbon nanotube comprises a plurality of carbon nanotubes.

11. The method of claim 1 wherein said carbon nanotube transistor is an nFET device.

12. The method of claim 11 wherein said carbon nanotube is annealed to remove oxygen therefrom.

13. The method of claim 1 wherein said carbon nanotube transistor is a pFET device.

14. The method of claim 1 wherein said carbon nanotube is hollow.

15. The method of claim 1 wherein said carbon nanotube is a single walled semiconductor material.

\* \* \* \* \*